United States Patent [19]

Gookin, Jr. et al.

[11] 4,127,811
[45] Nov. 28, 1978

[54] AUTO-CALIBRATING VOLTMETER

[75] Inventors: Albert B. Gookin, Jr.; Vernal D. Forbes; Stephen B. Venzke, all of Loveland, Colo.

[73] Assignee: Hewlett-Packard Company, Palo Alto, Calif.

[21] Appl. No.: 720,486

[22] Filed: Sep. 3, 1976

[51] Int. Cl.$^2$ .......................... G01R 1/02; G01R 17/06
[52] U.S. Cl. .................................. 324/130; 324/99 D; 324/111
[58] Field of Search ...................... 324/99 D, 111, 130; 328/162

[56] References Cited

U.S. PATENT DOCUMENTS

| | | | |
|---|---|---|---|
| 3,509,460 | 4/1970 | Mizrahi | 324/130 |
| 3,566,265 | 2/1971 | Reid | 324/99 D |
| 4,041,382 | 8/1977 | Washburn | 324/130 |

Primary Examiner—Rudolph V. Rolinec
Assistant Examiner—Ernest F. Karlsen
Attorney, Agent, or Firm—Michael L. Sherrard

[57] ABSTRACT

A voltmeter having multiple voltage ranges comprises substantially linear elements such that the transfer functions of the elements can be independently measured and logically combined to derive the transfer function of a given combination of elements configured to obtain a given voltage range.

4 Claims, 9 Drawing Figures

AUTO-CALIBRATING VOLTMETER

BACKGROUND & SUMMARY OF THE INVENTION

The calibration of voltmeters has previously been accomplished by measuring the outputs obtained upon the application of two known reference voltages and adjusting the transfer function thereof. Typically one of the reference voltages is ground and the other reference voltage is selected so as to produce a near full scale output. The drawback of this method is that separate full scale reference voltages are required for each voltage range, many calibration adjustments are required and 'drift' requires periodic calibration to retain full accuracy. Since reference voltages are inherently expensive, especially in the case of high voltage references, it is desirable to calibrate a multirange voltmeter using less than a reference voltage for each range.

It is therefore an object of the present invention to calibrate a voltmeter having multiple ranges without the need for a separate reference voltage for each range.

It is a further object of the present invention to achieve a high degree of accuracy in a voltmeter with a minimum of high precision components and adjustments.

These objects have been accomplished in accordance with the preferred embodiment of the present invention by independently measuring the transfer functions of circuit elements in the voltmeter and logically deriving the transfer functions of the combinations of the circuit elements corresponding to the circuit configurations of the voltmeter for the respective voltage ranges. This transfer function is then logically applied to the output obtained upon the application of an unknown signal so as to produce a calibrated output.

DESCRIPTION OF THE PREFERRED EMBODIMENT

Figure 1:
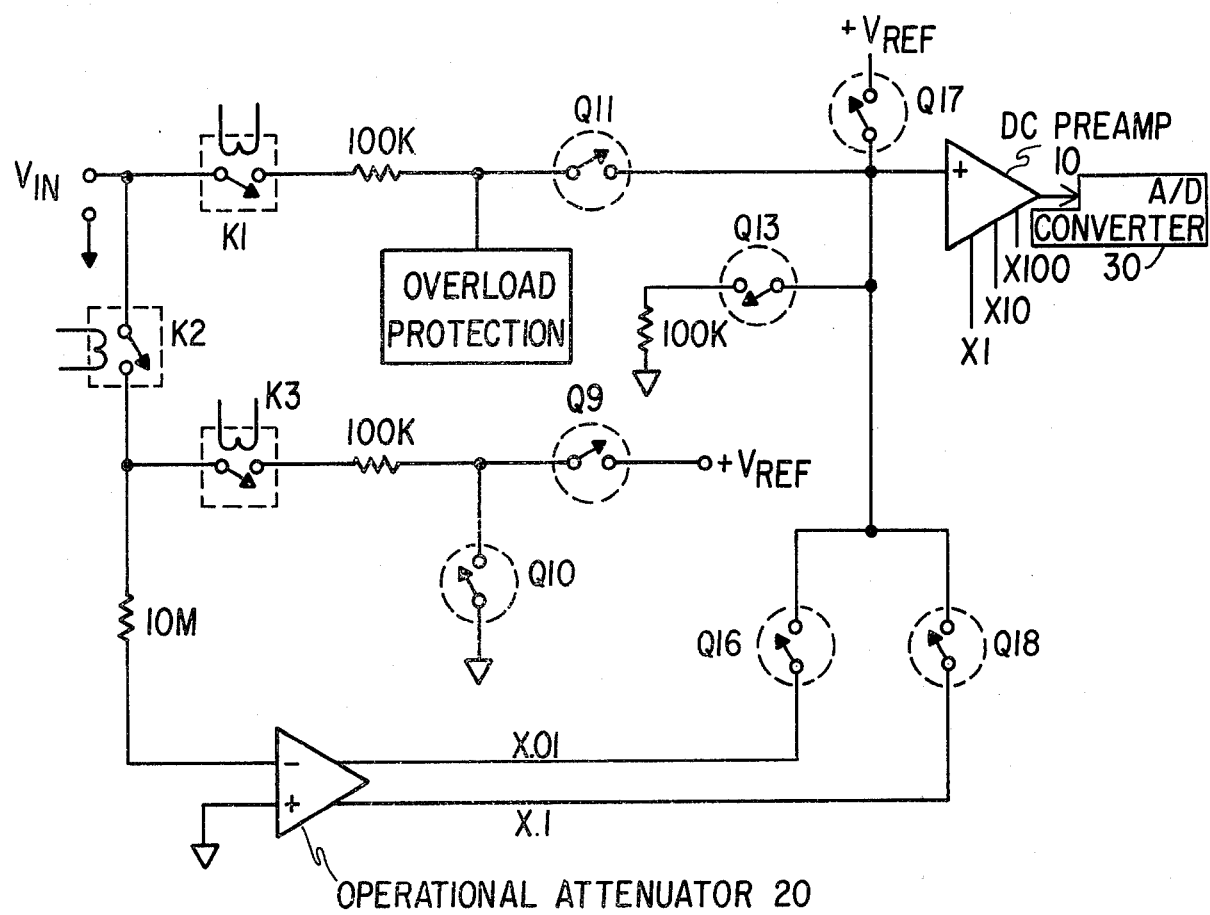
FIG. 1 is a block diagram of the preferred embodiment of the present invention.

Referring to FIG. 1, a block diagram of the preferred embodiment of the present invention, a voltmeter is illustrated having five voltage ranges. A first range (0.1V) is achieved by closing relay K1 and FET switch Q11 and selecting a gain of 100 from D.C. Preamplifier 10. A second range (1V) is achieved by selecting a gain of 10 from D.C. Preamplifier 10. A third range (10V) is achieved by selecting a gain of 1 from D.C. Preamplifier 10. A fourth range (100V) is achieved by closing relay K2 and selcting a gain of 0.1 from the Operational Attenuator 20 by closing FET switch Q16 and selecting a gain of 1 from the D.C. Preamplifier 10. A fifth range (1000V) is achieved by selecting a gain of 0.01 from the Operational Attenuator 20 and by closing FET switch Q18. Note that the full scale voltage applied to the Analog to Digital (A/D) Converter 30 is always ~10 volts.

Note also that the reference voltage, $V_{REF}$, can be applied to either the D.C. Preamplifier 10 by closing FET switch Q17, or to Operational Attenuator 20 by closing relay K3 and FET switch Q9. A ground input can similarly be applied to D.C. Preamplifier 10 by closing FET switch Q13, or to the Operational Attenuator 20 by closing relay K3 and FET switch Q10 and for the combined calibration of D.C. Preamplifier 10 in series with the Operational Attenuator 20 as will be discussed in detail below.

Figure 2:
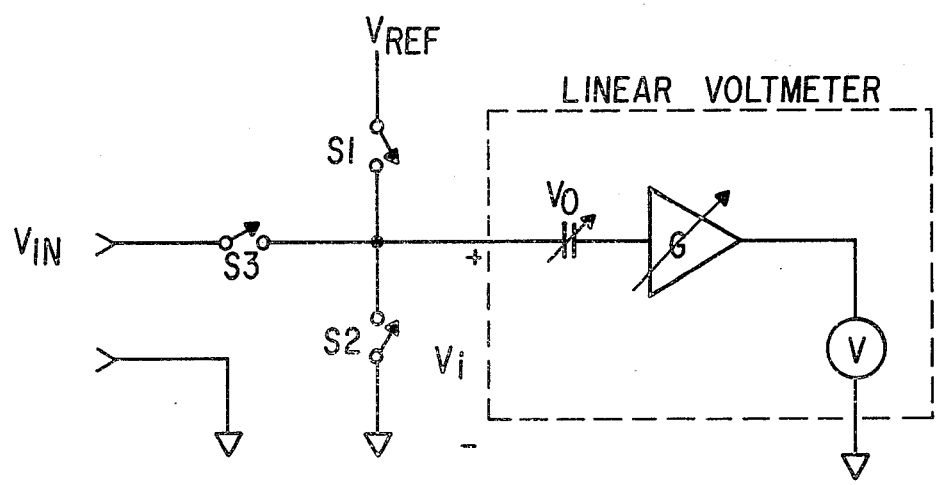
FIG. 2 is a circuit illustrating the prior art technique for calibrating a linear voltmeter.

The prior art techniques for calibration of a linear voltmeter in the prior art is illustrated in FIG. 2. The reading of meter V will be:

$$X_i = (V_i + V_o) G \quad (1)$$

where $V_o$ is the offset error of the voltmeter and G is the gain of the voltmeter. If switch S2 is closed such that $V_i = 0$, the reading of meter V will be:

$$X_o = V_o G. \quad (2)$$

If switch S1 is closed such that $V_i = V_{REF}$, the reading of meter V will be:

$$X_{REF} = (V_{REF} + V_o) G. \quad (3)$$

Combining equations (1), (2) and (3) gives the transfer function of the voltmeter when switch S3 is closed:

$$V_{IN} = V_{REF}(X_{IN} - X_{o,n})/(X_{REF} - X_{o,D}) \quad (4)$$

where $X_{o,n}$ is the offset of the voltmeter with a grounded input and $X_{o,D}$ is the offset of the voltmeter in a configuration prior to application of the reference voltage $V_{REF}$, in this case $X_o = X_{o,n} = X_{o,D}$.

By utilizing a voltmeter comprising highly linear elements, and further comprising logic for computing the transfer functions of the elements when configured for the various voltage ranges from the transfer functions of convenient calibration configurations, the present invention calibrates five voltage ranges with only a single reference voltage and a single precision resistive divider.

Figure 3:
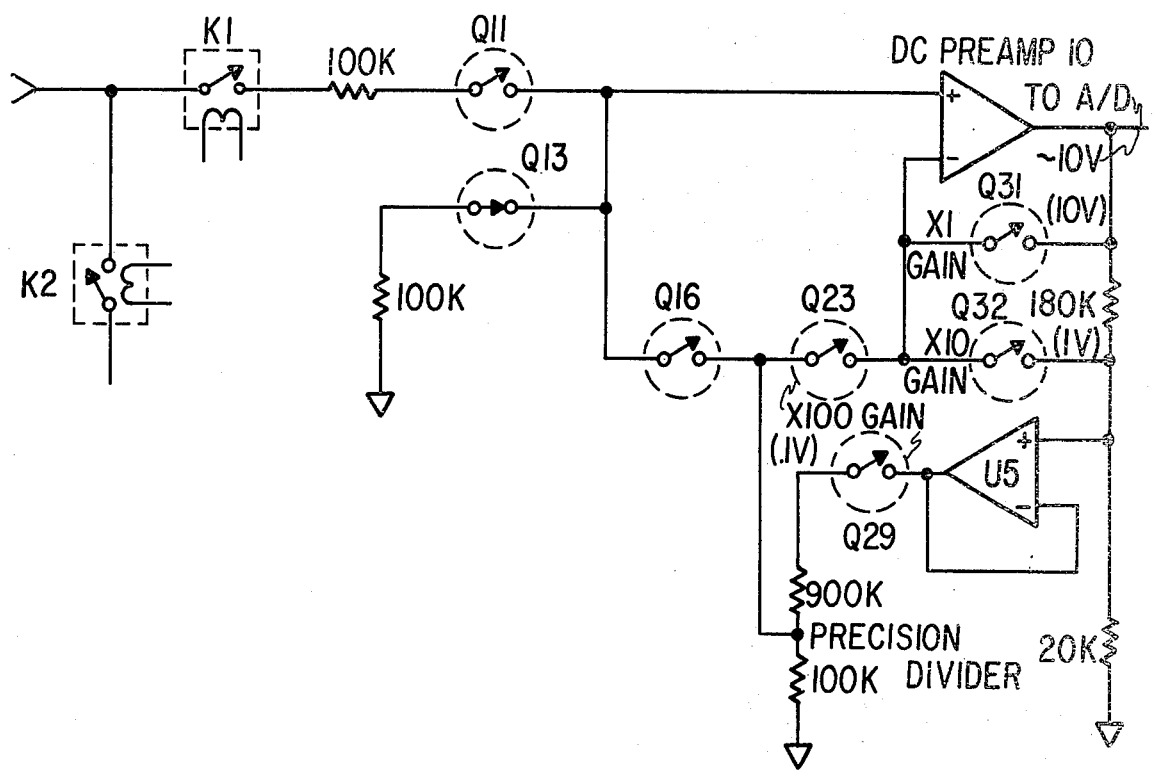
FIG. 3 is a detailed schematic of the D.C. Preamplifier 10 illustrating especially the measurement of the input offset errors $(-X_{o,n})$ for the first three voltage ranges.

Referring to FIG. 3, a detailed schematic of the D.C. Preamplifier 10, the input offset error measurements $(X_{o,n})$ for the first three voltage ranges are made with the input of the D.C. Preamplifier 10 grounded through a 100 K ohm resistor by FET switch Q13. A separate measurement is made for each range to include the respective configurations of FET switches Q31, Q32, Q23 and Q29 appropriate for each voltage range. These measurements will subsequently be referred to as $X_{o,n}^{0.1}, X_{o,n}^{1}$, and $X_{o,n}^{10}$.

Figure 4:
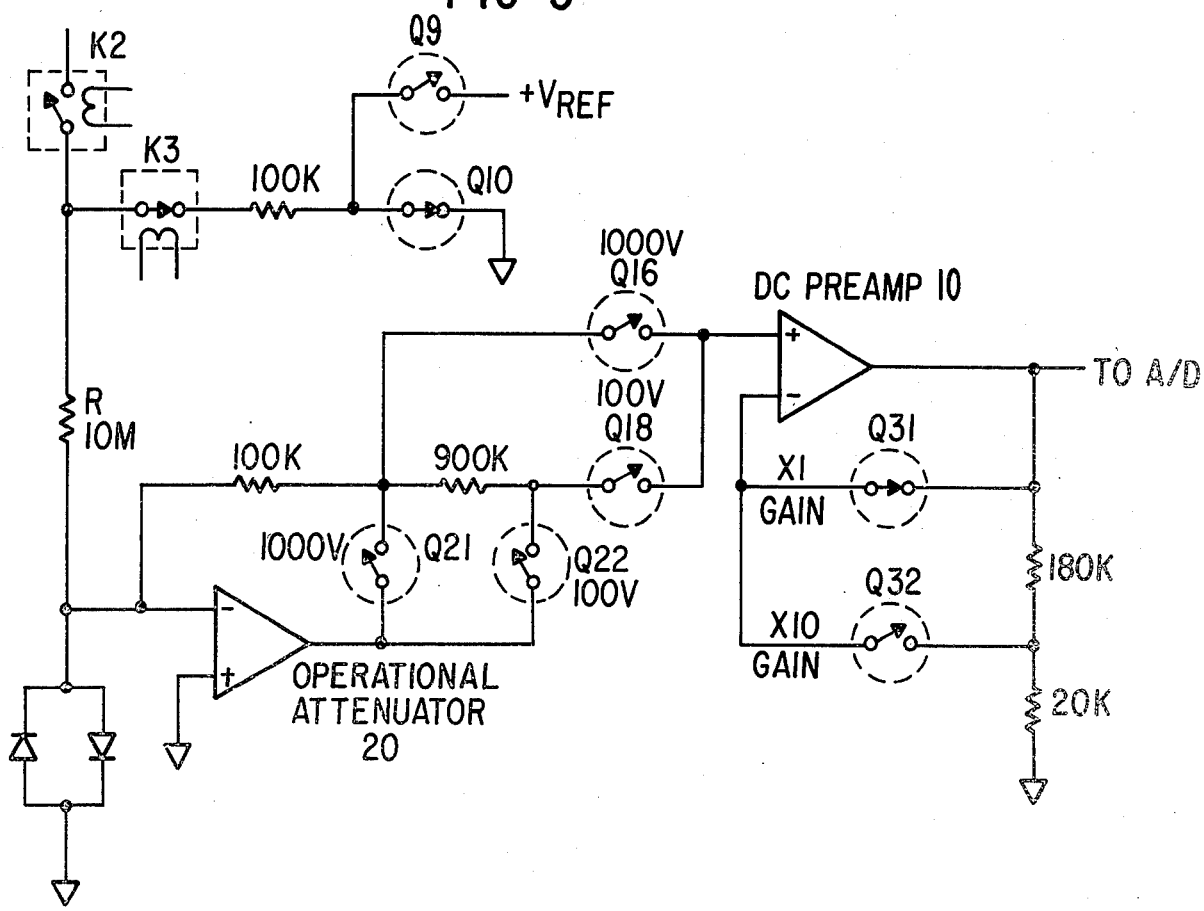
FIG. 4 is a detailed schematic of the Operational Attenuator 20 illustrating especially the measurement of the input offset errors $(X_{o,n})$ for the fourth and fifth voltage ranges.

Referring to FIG. 4, a detailed schematic of the Operational Attenuator 20, the input offset errors for the fourth and fifth (100V and 1000V) ranges are made with the input of Operational Attenuator 20 grounded through a 100 K ohm resistor by relay K3 and FET switch Q10. A separate measurement is made for each range. The fourth range is selected by closing FET switches Q22 and Q18. The fifth range is selected by closing FET switches Q21, and Q16. These measurements will be referred to as $X_{o,n}^{100}$ and $X_{o,n}^{1000}$.

Figure 5:
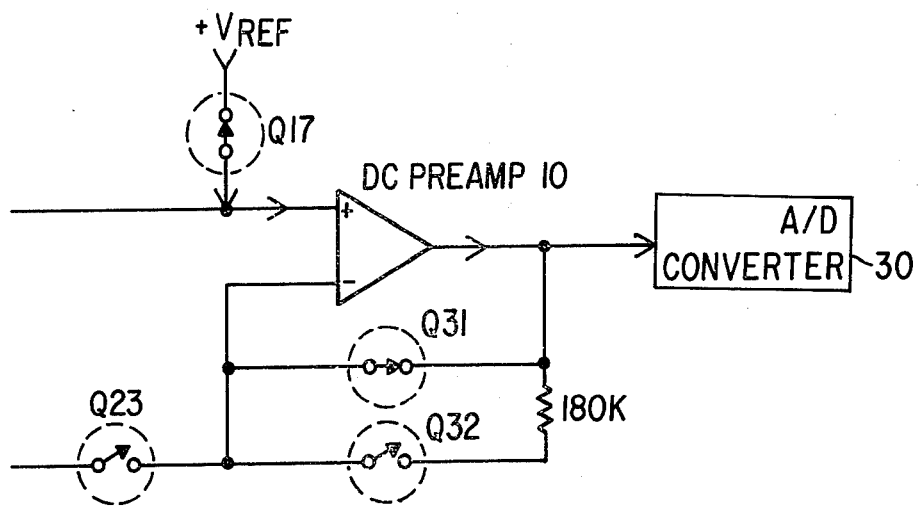
FIG. 5 illustrates the gain error measurement for the third (10V) range.

Referring now to FIG. 5, the gain error measurement for the third (10V) range is made by applying the internal precision reference voltage, $V_{REF}$, (+10 VDC) to the input of D.C. Preamplifier 10 through FET switch Q17. This measurement will be referred to as $X_{REF}^{10}$. The calibration of the third (10V) range is now determined by the relationship:

$$V_{IN}^{10} = V_{REF}(X_{IN} - X_{o,n}^{10})/(X_{REF}^{10} - X_{o,n}^{10}) \quad (5)$$

since for this configuration $X_{o,n}^{10} = X_{o,D}^{10}$.

Figure 6:
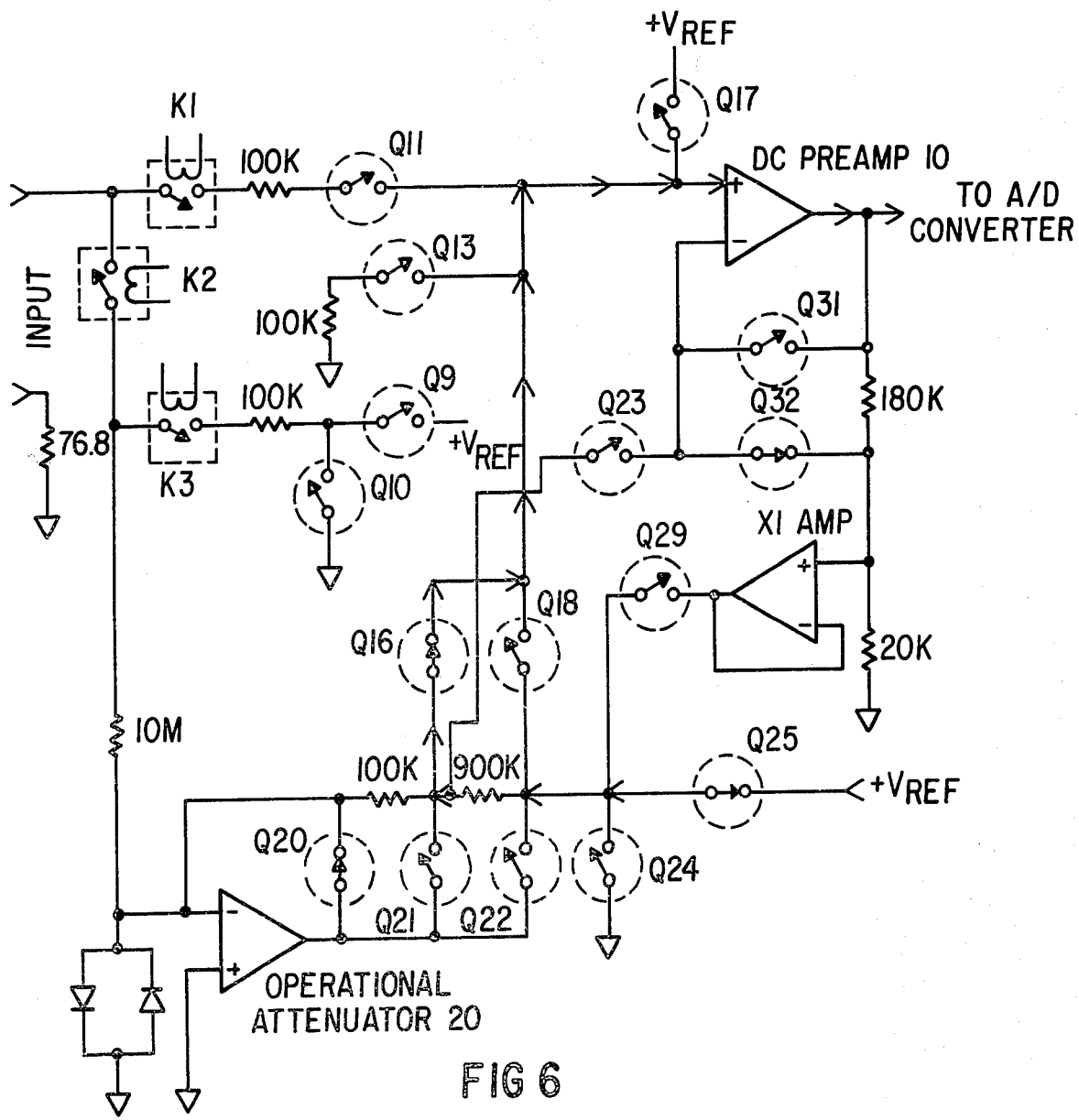
FIG. 6 illustrates the gain error measurement for the second (1V) range.
Figure 7:
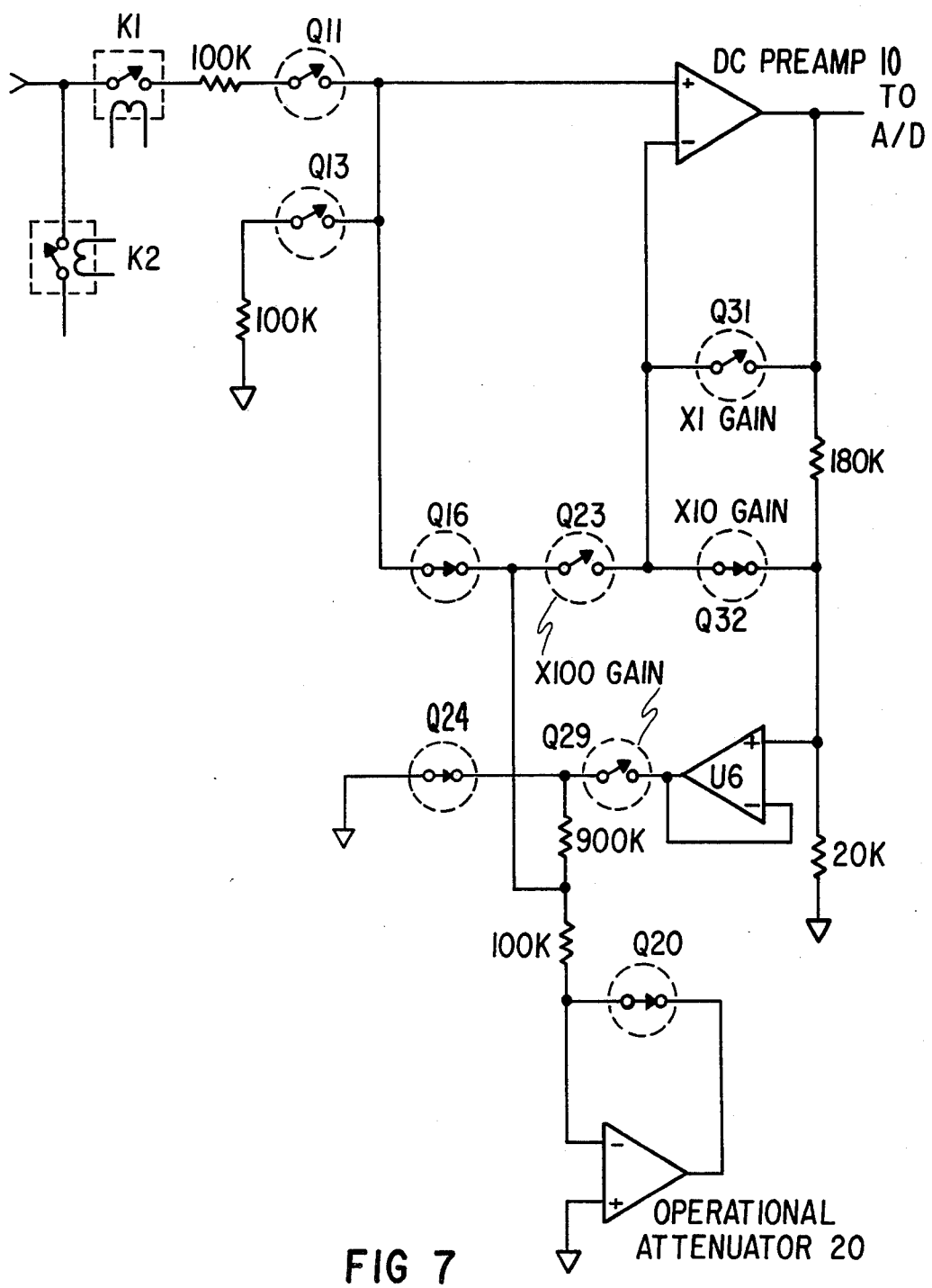
FIG. 7 illustrates the second offset error measurement for the second (1V) range.

Referring to FIG. 6, the gain error measurement for the second (1V) range is made by applying the internal precision reference voltage, $V_{REF}$, (+10 VDC) to the precision ten-to-one divider (900K/100K) by closing FETs Q25 and Q20. The one volt output is applied to D.C. Preamplifier 10 by FET switch Q16. The gain of the D.C. Preamplifier 10 is set to X10 to give a full scale output. This measurement will be referred to as $X_{REF}^{1}$. Referring to FIG. 7, a second offset, error measurement is made on the 1 VDC range with the input of the D.C. Preamplifier 10 grounded through the precision ten-to-one divider by FET switch Q16. This measurement is made to include offset errors which may be present during the gain error measurement and will be subsequently referred to as $X_{o,D}^{1}$. The calibration of the second (1 VDC) range is therefore determined by the relationship:

$$V_{IN}^{1} = V_{REF}/10 \frac{X_{IN} - X_{o,n}^{1}}{X_{REF}^{1} - X_{o,D}^{1}} \quad (6)$$

A separate gain error is not made for the first (0.1 VDC) range since only difference between the circuit configuration of the 1 VDC range and the 0.1 VDC range is a precise gain of 10 as determined by the precision ten-to-one divider. The calibration for the first range thus becomes:

$$V_{IN}^{0.1} = V_{REF}/100 \frac{X_{IN} - X_{o,n}^{0.1}}{X_{REF}^{1} - X_{o,D}^{1}} \quad (7)$$

Figure 8:
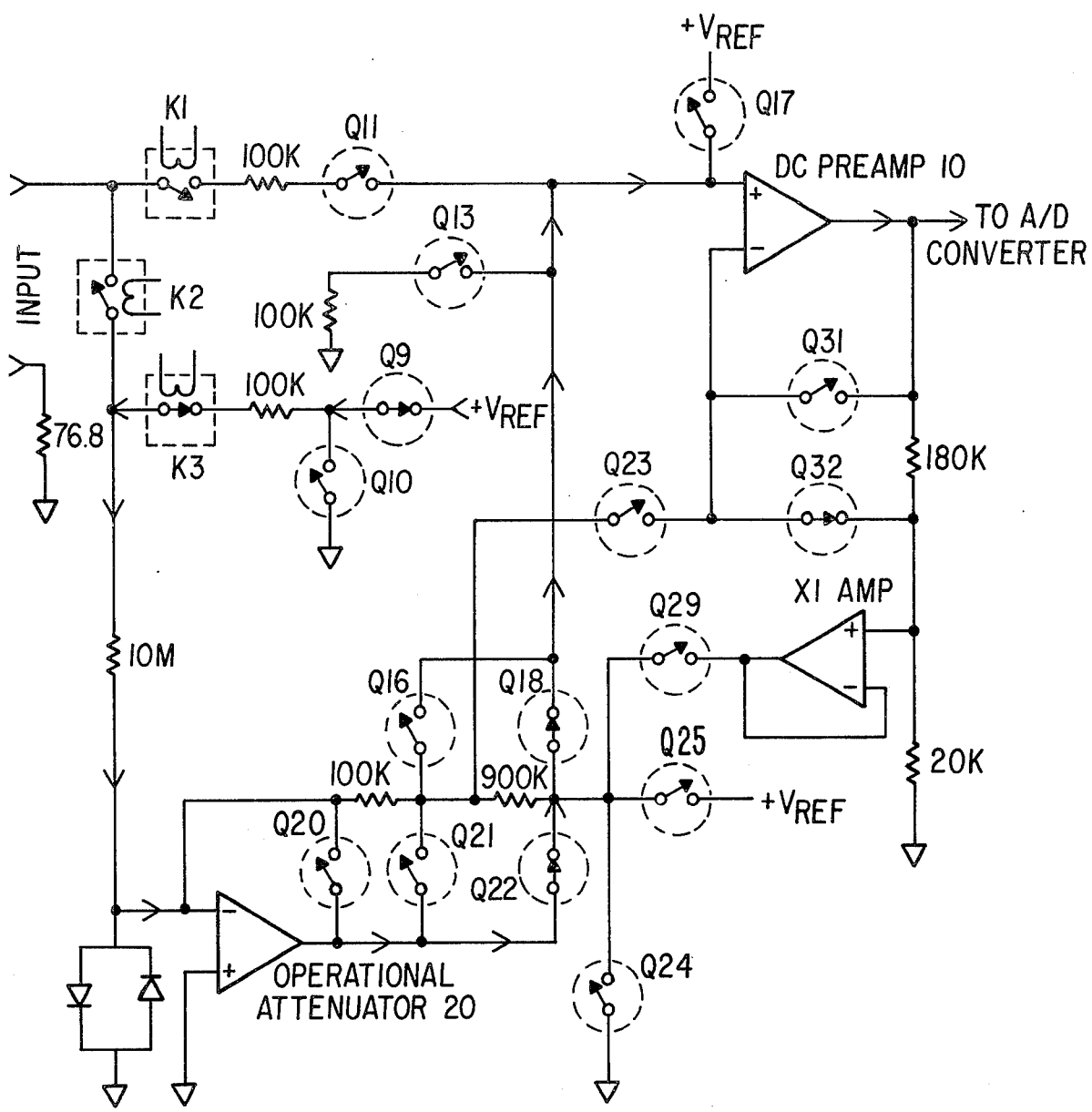
FIG. 8 illustrates the gain error measurement for the fourth (100V) range.

Referring to FIG. 8, for the 100 VDC range gain error measurement the internal precision voltage reference (10 VDC) is applied to the input of Operational Attenuator 20 through FET switch Q9 and relay K3. The attenuator gain is set to 0.1 by FET switch Q22. The output of the Operational Attenuator 20 is applied to the input of the D.C. Preamplifier 10 by FET switch Q18. The D.C. Preamplifier 10 is set to a gain of 10 to provide a 10 VDC full-scale output. This measurement will subsequently be referred to as $X_{REF}^{100}$. A second offset measurement is made on the 100 VDC range to include offsets which may be present during the reference voltage measurement. This measurement is identical to the measurement of $X_{o,n}^{100}$ described above and illustrated in FIG. 4 except that the D.C. Preamplifier 10 gain is set to $X^{10}$. This measurement will be subsequently referred to as $X_{o,D}^{100}$. Since the full-scale measurement was made with an X10 D.C. Preamplifier 10 gain configuration and an X1 D.C. Preamplifier 10 gain configuration is used in the 100 VDC range, the transfer function is corrected by dividing by the X10 gain and multiplying by the X1 gain. The calibration for the fourth (100 VDC) range therefore is determined by the relationship:

$$V_{IN}^{100} = 10 V_{REF} \frac{X_{IN} - X_{o,n}^{100}}{X_{REF}^{100} - X_{o,D}^{100}} \quad (8)$$

$$\frac{X_{REF}^{1} - X_{o,D}^{1}}{X_{REF}^{10} - X_{o,n}^{10}}$$

A separate gain error measurement is not required for the 1000 VDC range. Since the only difference between the 100 VDC and the 1000 VDC gain errors is a precise attenuation of 10 resulting from the precision ten-to-one divider. The calibration for the 1000 VDC range therefore becomes:

$$V_{IN}^{1000} = 100 V_{REF} \frac{X_{IN} - X_{o,n}^{1000}}{X_{REF}^{100} - X_{o,D}^{100}} \quad (9)$$

$$\frac{X_{REF}^{1} - X_{o,D}^{1}}{X_{REF}^{10} - X_{o,n}^{10}}$$

Figure 9:
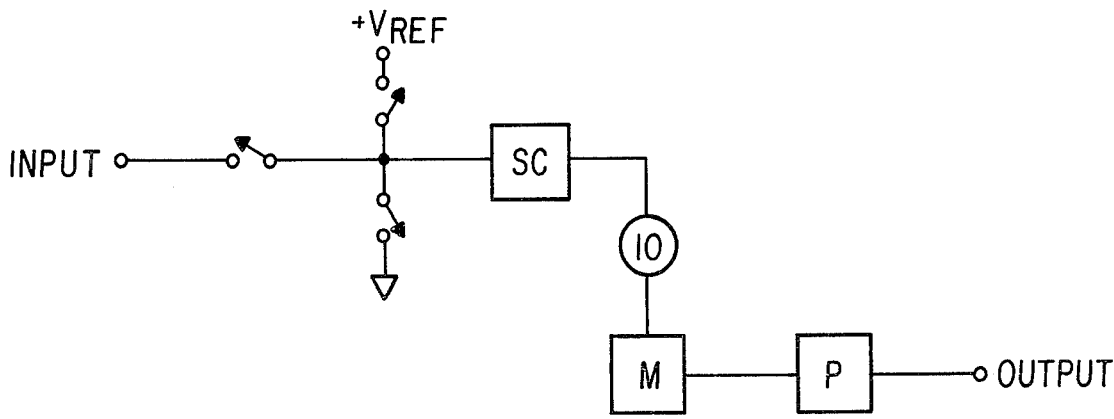
FIG. 9 illustrates an autocalibrating system.

FIG. 9 shows the autocalibrating system. The input voltage and the reference voltages are selectively applied to the input of a selected configuration of circuit elements SC. A detector 10, responsive to the output of the selected configuration, SC, loads selected outputs into a memory M. These selected outputs defines the transfer function of the selected configuration and can be logically combined with other transfer functions to determine the transfer function of selected configurations not directly measured. A processor, P, then combines the appropriate transfer function with the detected output when an unknown input voltage is applied and provides an output normalized for the transfer function of the configuration of circuit elements used for the measurement.

The objects of the present invention have been accomplished by the use of only two precision elements, a precise internal 10 VDC reference and a precise resistive divider. By having the processor periodically sample the correction factors during measurements and applying the corrective transfer functions to the output obtained from a measurement of an unknown voltage, an extremely accurate mode of voltage determination is accomplished, which constantly corrects for drifting components and requires a minimum amount of operator intervention for calibration.

We claim:

1. A voltmeter responsive to an input signal comprising:
   first and second amplifiers each having an input and an output and each having a substantially linear transfer characteristic between the input and output thereof;
   source means for supplying first, second and third reference voltages;
   first switching means for selectively applying either the first or the second reference voltage to the input of said first amplifier;
   second switching means for selectively applying either the first reference signal, the third reference signal, or the input signal to the input of said second amplifier;

analog to digital converter means having an input selectively coupled to the output of the first or second amplifier and an output for generating a digital signal representative of a signal applied to the input thereof;

means for selectively coupling the input of said first amplifier to the output of said second amplifier during the selective application of a reference signals by said second switching means;

a memory having an input and an output with the input coupled to the output of said converter means for selectively storing signals applied to the input thereof representative of the application of the first and second reference voltages to said first amplifier and the first and third reference voltages to said second amplifier; and processor means responsive to the selectively stored contents of said memory and to the output of said second amplifier for producing an output representative of the amplitude of the input signal normalized to correct for the offset and gain errors in said second amplifier.

2. A method for auto-calibrating a voltmeter comprising first and second amplifiers, each having an input and an output and a substantially linear transfer function therebetween, the method comprising the steps of, performed in selected sequence:

applying a known first voltage to the input of the first amplifier;

storing the output of the first amplifier responsive to the application of the known first voltage;

applying a known second voltage to the input of the first amplifier;

storing the output of the first amplifier responsive to the application of the known second voltage;

coupling the input of the first amplifier to the output of the second amplifier;

applying the known first voltage to the input of the second amplifier;

storing the output of the first amplifier responsive to the application of the known first voltage to the second amplifier;

applying a known third voltage to the input of the second amplifier;

storing the output of the first amplifier responsive to the application of the known third voltage to the second amplifier;

applying an unknown voltage to the input of the second amplifier;

generating a representation of the unknown voltage responsive to the output of the second amplifier during the application of the unknown voltage to the input thereof and further responsive to the stored outputs by logically normalizing the representation to correct for the linear transfer function of the second amplifier defined by the stored outputs and by the values of the known first, second and third voltages.

3. A voltmeter comprising:

an attenuator comprising a first differential amplifier having negative and positive inputs and an output, the positive input coupled to a source of first reference potential, a first resistor having a first terminal coupled to the negative input of the first differential amplifier, first switching means serially coupled between the output and the negative input of the first differential amplifier, second and third switching means each with first terminals coupled to the output of the first differential amplifier, a second resistor serially coupled between the second terminals of the second and third switch means, a third resistor serially coupled between the second terminal of the first switch means and the second terminal of the second switch means and fourth and fifth switch means having first terminals coupled together and second terminals coupled to the second terminals of the second and third switch means respectively;

an amplifier comprising a second differential amplifier having positive and negative inputs and an output, the positive input thereof coupled to the first terminal of the fourth switching means, a sixth switching means serially coupled between the output and the negative input of the second differential amplifier, a fourth resistor with a first terminal coupled to the output of the differential amplifier and a second terminal thereof coupled to a first terminal of a fifth resistor, the second terminal of the fifth resistor coupled to the source of first reference potential, seventh switching means coupled between the second terminal of the fourth resistor and the negative input of the second differential amplifier, eighth switching means coupled between the second terminal of the fourth resistor and the second terminal of the third switch means, and ninth switching means coupled between the second terminal of the second switching means and the negative input of the second differential amplifier; and first means for selectively coupling an input signal to either the positive input of the second differential amplifier or to the second terminal of the first resistor.

4. A voltmeter as in claim 3 further comprising:

second means for selectively coupling a source of first reference potential to the second terminal of the first resistor;

third means for selectively coupling a source of second reference potential to the second terminal of the first resistor;

fourth means for selectively coupling the source of first reference potential to the positive input of the second differential amplifier;

fifth means for selectively coupling the source of the second reference potential to the positive input of the second differential amplifier;

sixth means for selectively coupling either the source of first reference potential or the source of second reference potential to the second terminal of the third switching means;

analog to digital converter means coupled to the output said second differential amplifier for generating a digital signal representative of the signal input thereto;

digital circuit means coupled to said analog to digital converter means, to said first through ninth switching means, and to said first, second, and third means for selectively coupling, said circuit means for storing selected signals received from said analog to digital converter means, for producing an output responsive to the stored signals and to the input signal, and for selecting the configuration of said switching means and said means for selectively coupling.

* * * * *